United States Patent
Rouh et al.

(10) Patent No.: US 7,576,339 B2
(45) Date of Patent: *Aug. 18, 2009

(54) ION IMPLANTATION APPARATUS AND METHOD FOR OBTAINING NON-UNIFORM ION IMPLANTATION ENERGY

(75) Inventors: Kyoung Bong Rouh, Gyeonggi-do (KR); Seung Woo Jin, Gyeonggi-do (KR); Min Yong Jung, Seoul (KR); Yong Soo Jung, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 431 days.

This patent is subject to a terminal disclaimer.

(21) Appl. No.: 11/445,542

(22) Filed: Jun. 2, 2006

(65) Prior Publication Data

US 2008/0128639 A1    Jun. 5, 2008

(30) Foreign Application Priority Data

Apr. 28, 2006    (KR) ............... 10-2006-0038450

(51) Int. Cl.
*G21K 5/10* (2006.01)
*H01J 37/08* (2006.01)

(52) U.S. Cl. .................. 250/492.21; 250/396 R; 250/398; 250/423 R; 250/492.2; 313/359.1; 315/505; 315/5.41

(58) Field of Classification Search ........... 250/492.21, 250/396 R, 398, 423 R, 492.2; 313/359.1; 315/505, 5.41

See application file for complete search history.

(56) References Cited

U.S. PATENT DOCUMENTS

| 6,208,095 | B1 | 3/2001 | DiVergilio et al. |
| 6,242,747 | B1 | 6/2001 | Sugitani et al. |
| 6,423,976 | B1 | 7/2002 | Glavish et al. |
| 6,566,661 | B1 | 5/2003 | Mitchell |
| 6,583,429 | B2 | 6/2003 | Saadatmand et al. |
| 6,635,890 | B2 | 10/2003 | Saadatmand et al. |
| 6,653,643 | B2 | 11/2003 | Saadatmand et al. |
| 7,282,721 | B2 | 10/2007 | Sullivan et al. |
| 2008/0128640 | A1* | 6/2008 | Rouh et al. ............ 250/492.21 |

FOREIGN PATENT DOCUMENTS

| KR | 1020010084282 A | 9/2001 |
| KR | 1020020045537 A | 6/2002 |
| KR | 1020050074309 A | 7/2005 |
| WO | WO 02/054443 A2 | 7/2002 |

* cited by examiner

*Primary Examiner*—Jack I Berman
*Assistant Examiner*—Meenakshi S Sahu
(74) *Attorney, Agent, or Firm*—Townsend and Townsend and Crew LLP

(57) ABSTRACT

An ion implantation apparatus includes an ion beam source for generating an ion beam; an implantation energy controller disposed on a path of the ion beam for controlling the ion implantation energy of the ion beam so that an ion beam having a first implantation energy is created for a first period of time and an ion beam having a second implantation energy is created for a second period of time; a beam line for accelerating the ion beam; and an end station for mounting a substrate, into which the ion beam accelerated by the beam line is implanted onto the substrate.

11 Claims, 6 Drawing Sheets

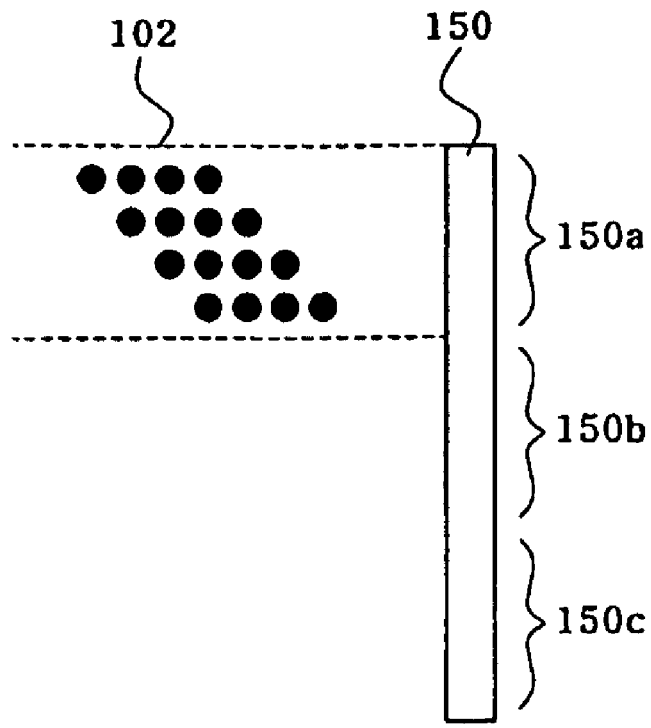
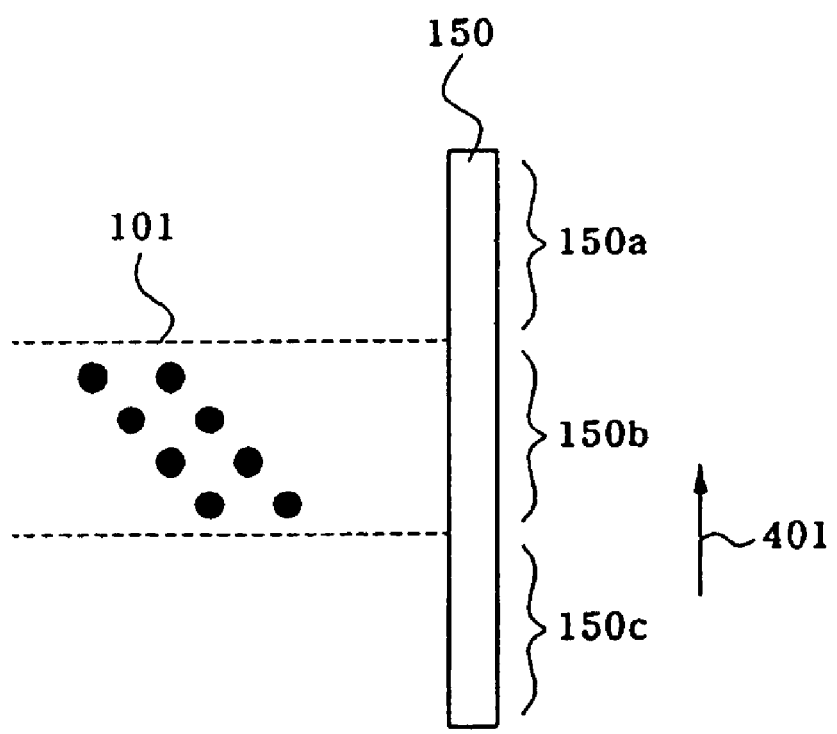

ION IMPLANTATION APPARATUS AND METHOD FOR OBTAINING NON-UNIFORM ION IMPLANTATION ENERGY

BACKGROUND OF THE INVENTION

The present invention relates to ion implantation apparatus and method, and more particularly to ion implantation apparatus and method for obtaining non-uniform ion implantation energy.

Generally, in order to manufacture a semiconductor device, particularly, a semiconductor memory device, such as a Dynamic Random Access Memory (DRAM), various unit processes are required. The unit processes include a stacking process, an etching process, and an ion implantation process, and are usually performed on a wafer. In the ion implantation process, dopant ions, such as boron and arsenic, are accelerated and pass through the surface of a wafer. Electric characteristics of a material can be changed by the above ion implantation process.

The ion implantation into the wafer is achieved by moving the wafer in the direction of the Y-axis, and scanning an ion beam in the direction of the X-axis and implanting the ion beam into the wafer. In the above ion implantation, ions are implanted into all regions of the wafer at the same dose and energy. This is preferable to the ion implantation process, but is not preferable to other unit processes. That is, as a result of various unit processes, thicknesses and etching degrees of obtained films over all regions of the wafer are not uniform. The reason is that many variables of the unit processes cannot be accurately controlled. Accordingly, process errors due to the process variables, which are not expected or accurately controlled, occur.

For example, critical dimensions (hereinafter, referred to as CDs) representing the widths of the gate electrodes are different according to regions of a wafer. That is, the CD of the gate electrode at the center of the wafer may be relatively large, and the CD of the gate electrode at the edge of the wafer may be relatively small. On the other hand, the CD of the gate electrode at the center of the wafer may be relatively small, and the CD of the gate electrode at the edge of the wafer may be relatively large. The above difference of the CDs is caused by the uncontrolled variables of the unit processes. In case that the CD of the gate electrode at the center of the wafer is larger than the CD of the gate electrode at the edge of the wafer, the threshold voltage of a device at the center of the wafer is larger than the threshold voltage of a device at the edge of the wafer. In case that the CD of the gate electrode at the center of the wafer is smaller than the CD of the gate electrode at the edge of the wafer, the threshold voltage of the device at the center of the wafer is smaller than the threshold voltage of the device at the edge of the wafer.

Further, in order to form a source/drain having a Lightly Doped Drain (LDD) structure, spacers are formed on side surfaces of a gate stack, and source/drain ion implantation using the spacers as an ion implantation barrier is performed. Since the thickness of the spacers is not uniform over all regions of a wafer, the source/drain having the LDD structure has a non-uniform profile, thereby causing transistors to have non-uniform characteristics.

SUMMARY OF THE INVENTION

The present invention provides an ion implantation apparatus, which implants ions into a wafer at different ion implantation energies according to regions of the wafer.

The present invention also provides an ion implantation method, in which ions are implanted into a wafer at different ion implantation energies according to regions of the wafer.

In accordance with one embodiment of the present invention, an ion implantation apparatus comprises: an ion beam source for generating an ion beam; an implantation energy controller disposed on a path of the ion beam for controlling the ion implantation energy of the ion beam so that an ion beam having a first implantation energy is created for a first period of time and an ion beam having a second implantation energy is created for a second period of time; a beam line for accelerating the ion beam; and an end station for mounting a wafer, into which the ion beam accelerated by the beam line is implanted onto the wafer, and moving the wafer in the direction perpendicular to an ion beam incident direction, so that the ion beam having the first implantation energy is implanted into a first region of the wafer and the ion beam having the second implantation energy is implanted into a second region of the wafer.

In some embodiments, the first implantation energy is relatively low. The second implantation energy may be relatively high.

The implantation energy controller may comprise a plurality of bundle ion beam generators, each of which comprises an electrode disposed on the path of the ion beam and a resonator for switching the electrode on and off, arranged along the path of the ion beam.

A relatively small number of the plurality of bundle ion beam generators may be switched on for the first period of time, and a relatively large number of the plurality of bundle ion beam generators may be switched on for the second period of time.

The resonator may switch the electrode on by sequentially applying a positive bias current and a negative bias current to the electrode.

The end station may comprise a wafer supporter for rotating the wafer when the ion beam is implanted into the wafer.

In accordance with another embodiment of the present invention, an ion implantation apparatus comprises: an ion beam source for generating an ion beam; an implantation energy controller accelerating the ion beam, disposed on a path of the accelerated ion beam, and controlling the ion implantation energy of the ion beam so that an ion beam having a first implantation energy is created for a first period of time and an ion beam having a second implantation energy is created for a second period of time; and an end station for mounting a wafer, into which the ion beam, the ion implantation energy of which is controlled by the implantation energy controller, is implanted, thereon and moving the wafer in the direction perpendicular to an ion beam incident direction, so that the ion beam having the first implantation energy is implanted into a first region of the wafer and the ion beam having the second implantation energy is implanted into a second region of the wafer.

The end station may comprise a wafer supporter for rotating the wafer when the ion beam is implanted into the wafer.

In accordance with yet another embodiment of the present invention, an ion implantation method comprises: controlling the ion implantation energy of an ion beam so that an ion beam having a first implantation energy is created for a first period of time and an ion beam having a second implantation energy is created for a second period of time; and implanting ions into a wafer disposed on a path of the ion beam under the condition that the wafer is moved in the direction perpendicular to an ion beam incident direction when the ion beam is implanted into the wafer, so that the ion beam having the first implantation energy is implanted into a first region of the wafer and the ion beam having the second implantation energy is implanted into a second region of the wafer.

The ion implantation method may further comprise rotating the wafer during the implanting of the ions.

The controlling of the ion implantation energy may comprise arranging a plurality of bundle ion beam generators, each of which comprises an electrode and a resonator for switching the electrode on and off, along the path of the ion beam; and switching a relatively small number of the plurality of bundle ion beam generators on for the first time, and switching a relatively large number of the plurality of bundle ion beam generators on for the second time.

BRIEF DESCRIPTION OF THE DRAWINGS

The present invention will be more clearly understood from the following detailed description taken in conjunction with the accompanying drawings, in which:

FIGS. 8 to 10 are views for illustrating an ion implantation method in accordance with an embodiment of the present invention.

DESCRIPTION OF THE EMBODIMENTS

Embodiments of the present invention will be described in detail with reference to the annexed drawings. The embodiments of the present invention may be variously modified, and the scope and spirit of the invention are not limited by the embodiments.

Figure 1:
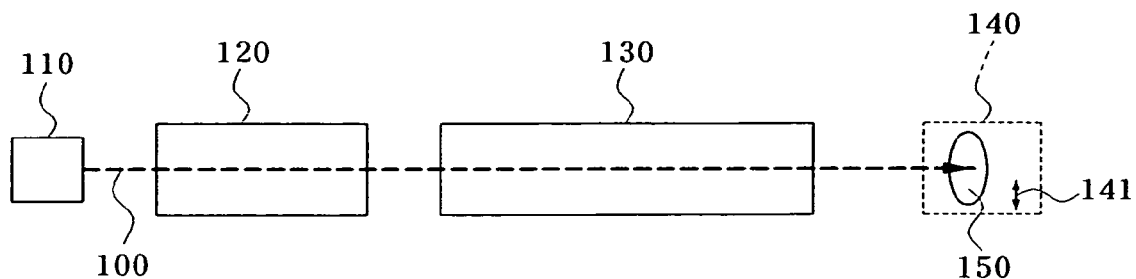
FIG. 1 is a schematic view of an ion implantation apparatus in accordance with one embodiment of the present invention.

FIG. 1 is a schematic view of an ion implantation apparatus in accordance with one embodiment of the present invention.

With reference to FIG. 1, the ion implantation apparatus of this embodiment comprises an ion beam source 110, an implantation energy controller 120, a beam line 130, and an end station 140. The ion beam source 110 generates an ion beam, and the ion beam travels along a beam path 100. The implantation energy controller 120 is disposed on the beam path 100, and controls the ion implantation energy of the ion beam generated from the beam source 110. For example, the implantation energy controller 120 creates and emits an ion beam having a first implantation energy for a first period of time, and creates and emits an ion beam having a second implantation energy for a second period of time. In some embodiments, the first implantation energy is relatively low. In some embodiments, the second implantation energy is relatively high. The beam line 130 accelerates the beam, the ion implantation energy of which is controlled. The end station 140 is an area on which a wafer 150 is mounted, and includes a wafer supporter (not shown) for supporting the wafer 150. The wafer supporter moves the wafer 150 in a direction, as shown by an arrow 141, perpendicular to the ion beam implantation direction. The moving speed of the wafer 150 by the wafer supporter relates to the operation of the implantation energy controller 120. More specifically, the moving speed of the wafer 150 by the wafer supporter is suitably controlled so that the ion beam having the first implantation energy is implanted into a first region of the wafer and the ion beam having the second implantation energy is implanted into a second region of the wafer. If necessary, the wafer supporter may rotate the wafer 150.

Figure 2:
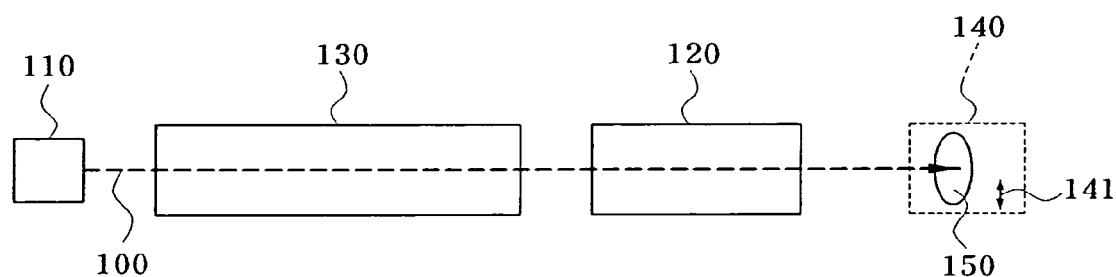
FIG. 2 is a schematic view of an ion implantation apparatus in accordance with another embodiment of the present invention.

FIG. 2 is a schematic view of an ion implantation apparatus in accordance with another embodiment of the present invention. Some parts in FIG. 2, which are substantially the same as those in FIG. 1, are denoted by the same reference numerals even though they are depicted in different drawings.

With reference to FIG. 2, the ion implantation apparatus of this embodiment is different from the ion implantation apparatus of the earlier embodiment in that the implantation energy controller 120 is disposed between the beam line 130 and the end station 140. Thereby, an ion beam generated from the beam source 110 is accelerated by the beam line 130, and is incident upon the implantation energy controller 120. The implantation energy controller 120 controls the ion implantation energy of the incident ion beam, before emitting the ion beam. For example, the implantation energy controller 120 emits an ion beam having a first implantation energy, which is relatively low, for a first period of time, and emits an ion beam having a second implantation energy, which is relatively high, for a second period of time. The ion beam, the ion implantation energy of which is controlled, is implanted into the wafer 150 on the end station 140. In this embodiment, the wafer supporter of the end station 140 for supporting the wafer 150 moves the wafer 150 in a direction, as shown by the arrow 141, perpendicular to the ion beam implantation direction also. If necessary, the wafer supporter may rotate the wafer 150.

In accordance with yet another embodiment of the present invention, which is not shown in the drawings, the implantation energy controller 120 may be disposed in the beam line 130. The operation of the implantation energy controller 120 of this embodiment is the same as those of the first and second embodiments, except that the controlling operation of the ion implantation energy of the ion beam is performed in the beam line 130.

Figure 3:
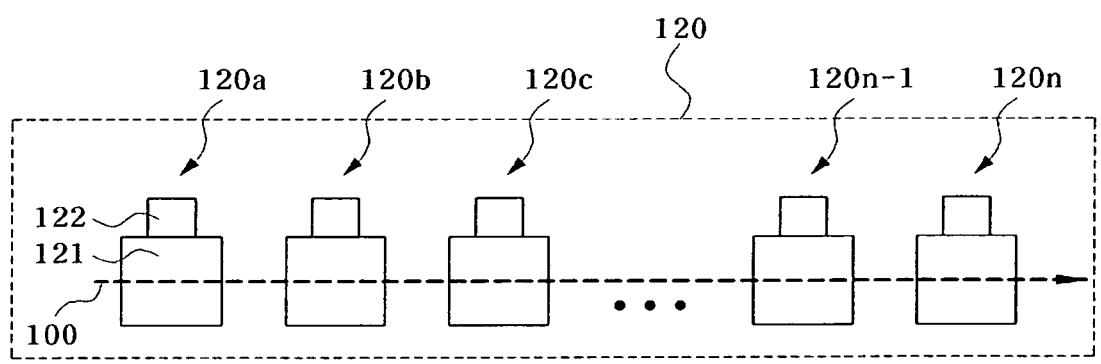
FIG. 3 is a view for illustrating the structure and operation of an implantation energy controller of FIGS. 1 and 2.

FIG. 3 is a view for illustrating the structure and operation of the implantation energy controller of FIGS. 1 and 2.

With reference to FIG. 3, the implantation energy controller 120 comprises a plurality of bundle ion beam generators (120a, 120b, 120c, ... 120n-1, and 120n), which are disposed on the beam path 100. Each of the bundle ion beam generators comprises an electrode 121 disposed on the beam path 100, and a resonator 122 for switching the electrode 121 on and off. When the electrode 121 is switched on by the resonator 122, a positive bias current and a negative bias current are sequentially applied to the electrode 121 by a resonance signal of the resonator 122. Then, a bundle ion beam having a bundle of ions is created, and passes through the electrode 121. The bundle ion beam has an increased weight and thus has increased acceleration, thereby increasing the ion implantation energy. On the other hand, when the electrode 121 is switched off by the resonator 122, the bundle ion beam is not additionally created and thus the weight of the bundle ion beam is not changed. Accordingly, the ion implantation energy is not changed.

Hereinafter, a process for controlling the ion implantation energy of the ion beam using the above principle will be described.

First, during the first period of time when the implantation energy controller 120 creates and emits the ion beam having a relatively low first implantation energy, a relatively small number of the bundle ion beam generators are switched on, and the remainder of the bundle ion beam generators are switched off. In this case, the bundle ion beam passing through the implantation energy controller 120 has the relatively low implantation energy. As circumstances require, when all the bundle ion beam generators (120a, 120b, 120c, . . . 120n-1) are switched off, the ion beam, the ion implantation energy of which is not increased, passes through the implantation energy controller 120. When the ion implantation is performed so that the bundle ion beam having the relatively low implantation energy is created, an obtained impurity region has a relatively shallow junction depth.

On the other hand, during the second period of time when the implantation energy controller 120 creates and emits the ion beam having a relatively high second implantation energy, a relatively large number of the bundle ion beam generators are switched on, and the remainder of the bundle ion beam generators are switched off. In this case, the bundle ion beam passing through the implantation energy controller 120 has the relatively high implantation energy. As circumstances require, when all the bundle ion beam generators (120a, 120b, 120c, . . . 120n-1) are switched on, the ion beam, the ion implantation energy of which is maximized, is created and passes through the implantation energy controller 120. When the ion implantation is performed so that the bundle ion beam having the relatively high implantation energy is created, the obtained impurity region has a relatively deep junction depth.

Figure 4:
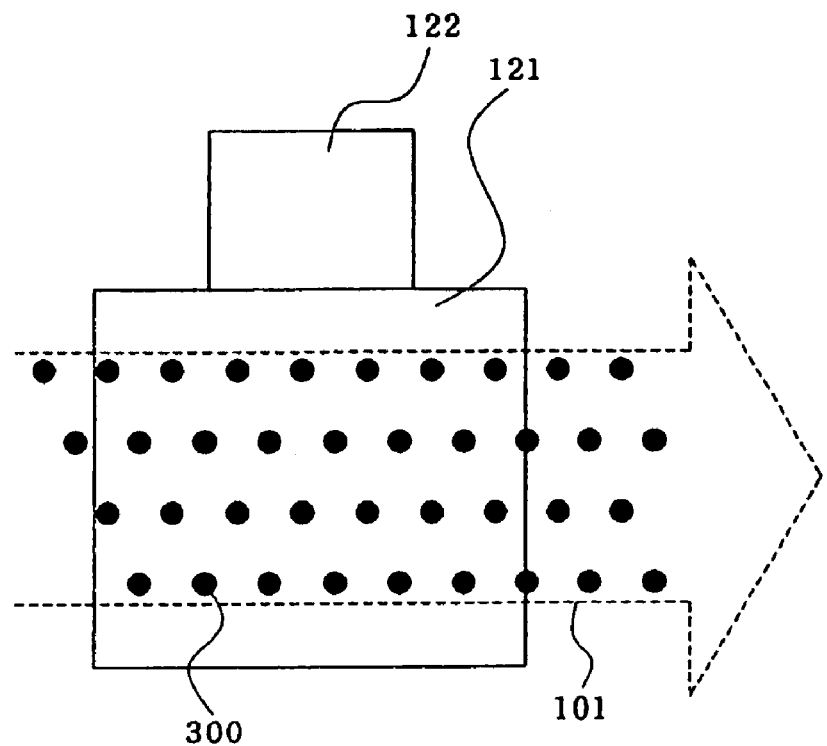
FIGS. 4 and 5 are views for illustrating the operation of one bundle ion beam generator of the implantation energy controller of FIG. 3.
Figure 5:
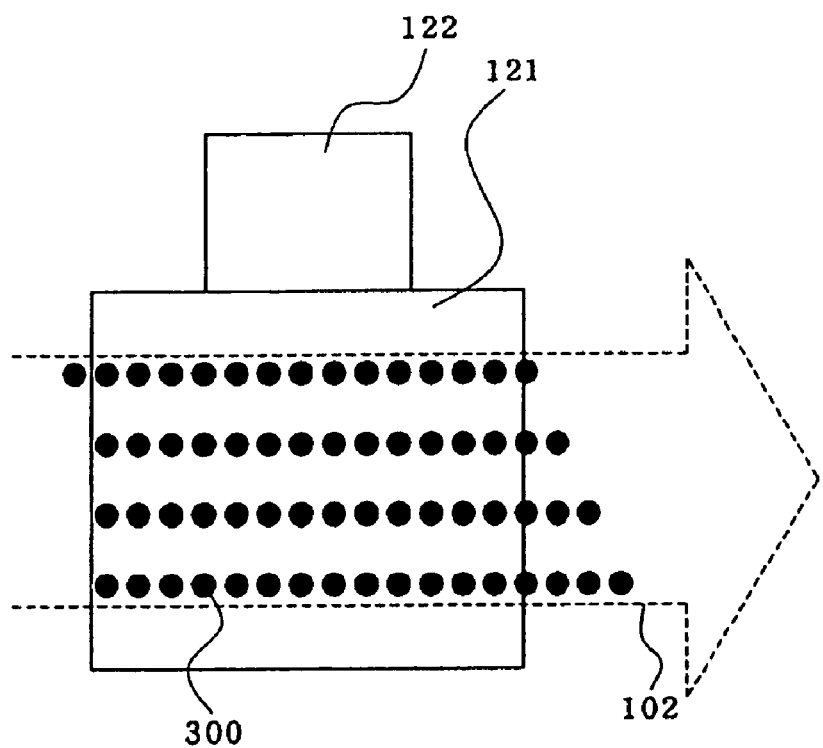

FIGS. 4 and 5 are views for illustrating the operation of one bundle ion beam generator of the implantation energy controller of FIG. 3.

First, with reference to FIG. 4, when the electrode 121 is switched off by the resonator 122, a bundle ion beam is not created, but the ion beam 101, in which ions 300 are relatively sparsely distributed, passes through the implantation energy controller 120. On the other hand, with reference to FIG. 5, when the electrode 121 is switched on by the resonator 122, the bundle ion beam 102, in which ions 300 are relatively densely distributed, is created and passes through the implantation energy controller 120.

Figure 6:
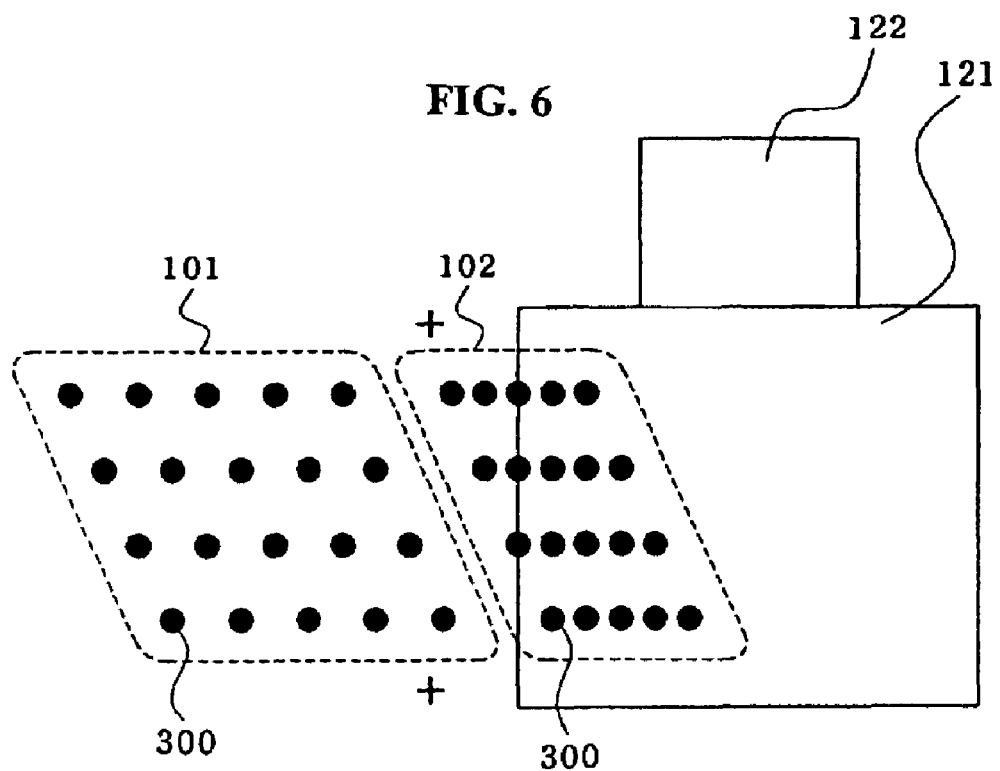
FIGS. 6 and 7 are views for illustrating a method for forming a bundle ion beam using the bundle ion beam generator of FIG. 3.
Figure 7:
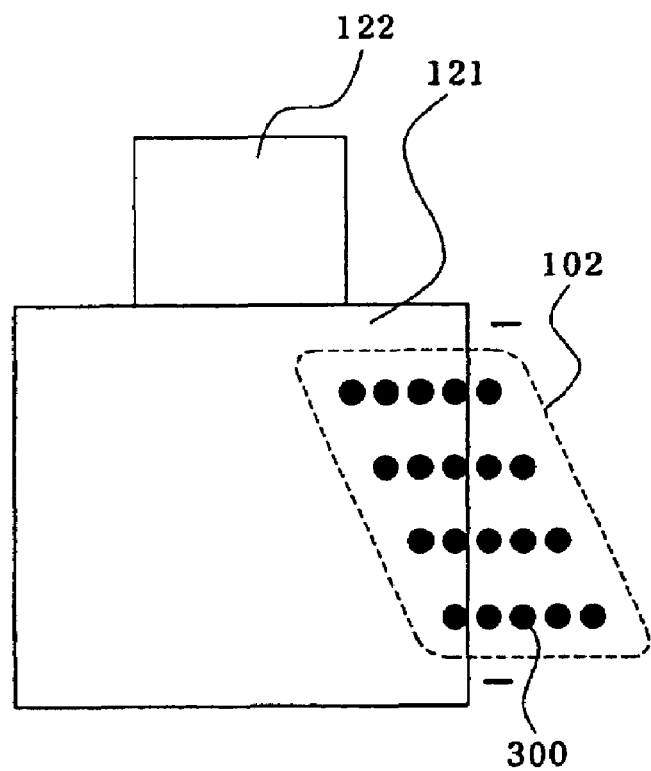

FIGS. 6 and 7 are views for illustrating a method for forming a bundle ion beam using the bundle ion beam generator of FIG. 3.

First, with reference to FIG. 6, when the initial ion beam 101 is incident upon the bundle ion beam generator, the resonator 122 applies a positive bias current to the electrode 121. In some embodiments, the resonator 122 is an RLC resonator. Resonator 122 sequentially applies a positive bias current and a negative bias current to the electrode 121 according to a designated frequency determined by the capacitance of a capacitor. When the positive bias current is applied to the electrode 121, repulsive force is incurred between the positive ions 300 of the initial ion beam 101 and the electrode 121. The initial ion beam 101 does not pass through the electrode 121 due to the repulsive force, and the ions 300 of the initial ion beam 101 accumulate at the front end of the electrode 121. Thereby, the bundle ion beam 102, in which the ions 300 are relatively densely distributed, is created.

Next, with reference to FIG. 7, after the bundle ion beam 102 having a proper density is created, the resonator 122 applies a negative bias current to the electrode 121. As described above, the negative bias current is applied to the electrode 121 by the resonating operation of the resonator 122. When the negative bias current is applied to the electrode 121, an attractive force is incurred between the bundle ion beam 102 and the electrode 121. The bundle ion beam 102 is attracted to the rear end of the electrode 121 by the attractive force, and passes through the bundle ion beam generator.

Figure 10:
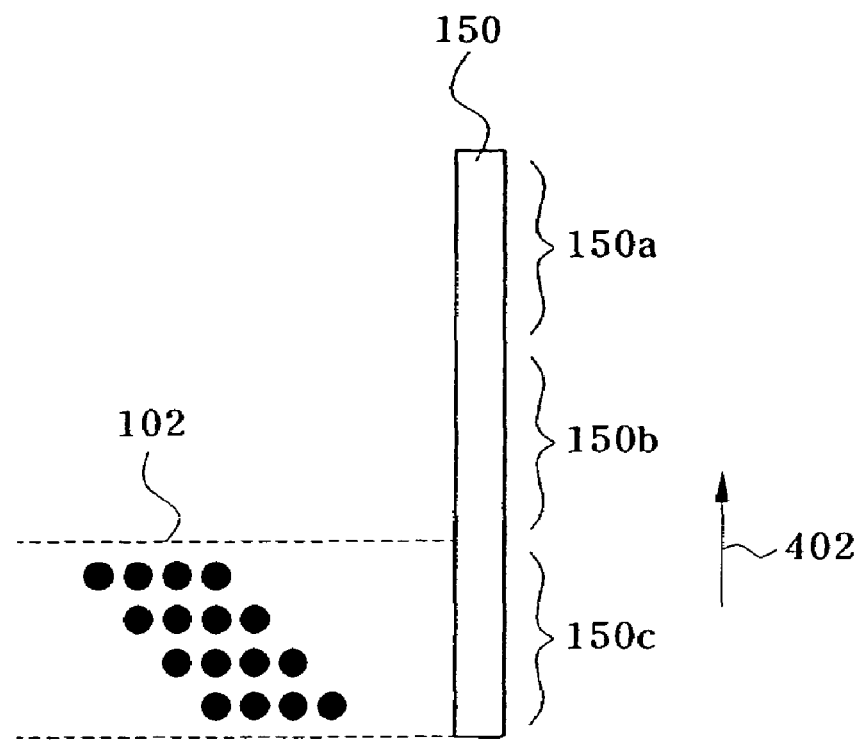

FIGS. 8 to 10 are views for illustrating an ion implantation method in accordance an embodiment of the present invention.

First, as shown in FIG. 8, the wafer 150 is divided into a first region 150a, a second region 150b, and a third region 150c so that ions are implanted into the first, second, and third regions 150a, 150b, and 150c at different implantation energies. Here, in order to perform ion implantation so that ions are implanted into the first region 150a and the third region 150c of the wafer 150 at a relatively high implantation energy and ions are implanted into the second region 150b of the wafer 150 at a relatively low implantation energy, the implantation energy controller 120 creates the ion beam 102 having a high implantation energy, and the ion beam 102 having the high implantation energy is implanted into the first region 150a of the wafer 150.

Thereafter, as shown in FIG. 9, the wafer 150 is moved in the direction (with reference to the arrow 401) perpendicular to the ion beam incident direction. The moving speed of the wafer 150 is controlled so that the completion of the moving of the wafer 150 corresponds to a point of time when the implantation energy controller 120 generates the ion beam 101 having a relatively low implantation energy. Then, the ion beam 101 having the relatively low implantation energy is implanted into the second region 150b of the wafer 150. Thereafter, as shown in FIG. 10, when the implantation energy controller 120 creates the ion beam 102 having the relatively high implantation energy again, the wafer 150 is moved in the direction (with reference to the arrow 401) perpendicular to the ion beam incident direction, and the ion beam 102 having the relatively high implantation energy is implanted into the third region 150c of the wafer 150.

Figure 11:
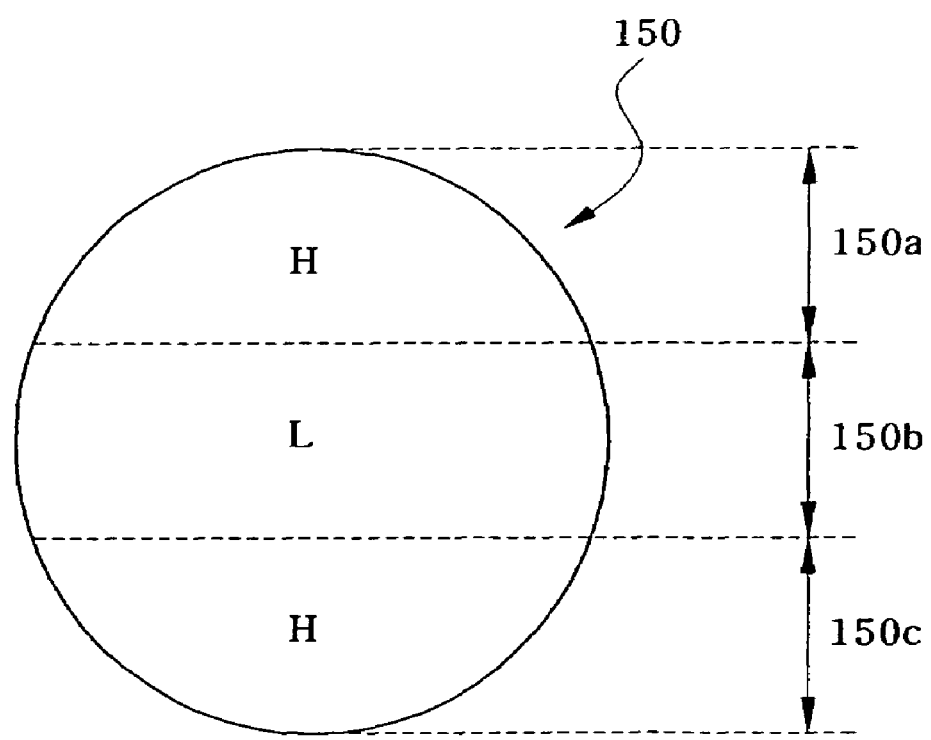
FIGS. 11 and 12 are views for illustrating the distributions of ion implantation energy in a wafer, into which ions are implanted using the ion implantation method in accordance with an embodiment of the present invention.
Figure 12:
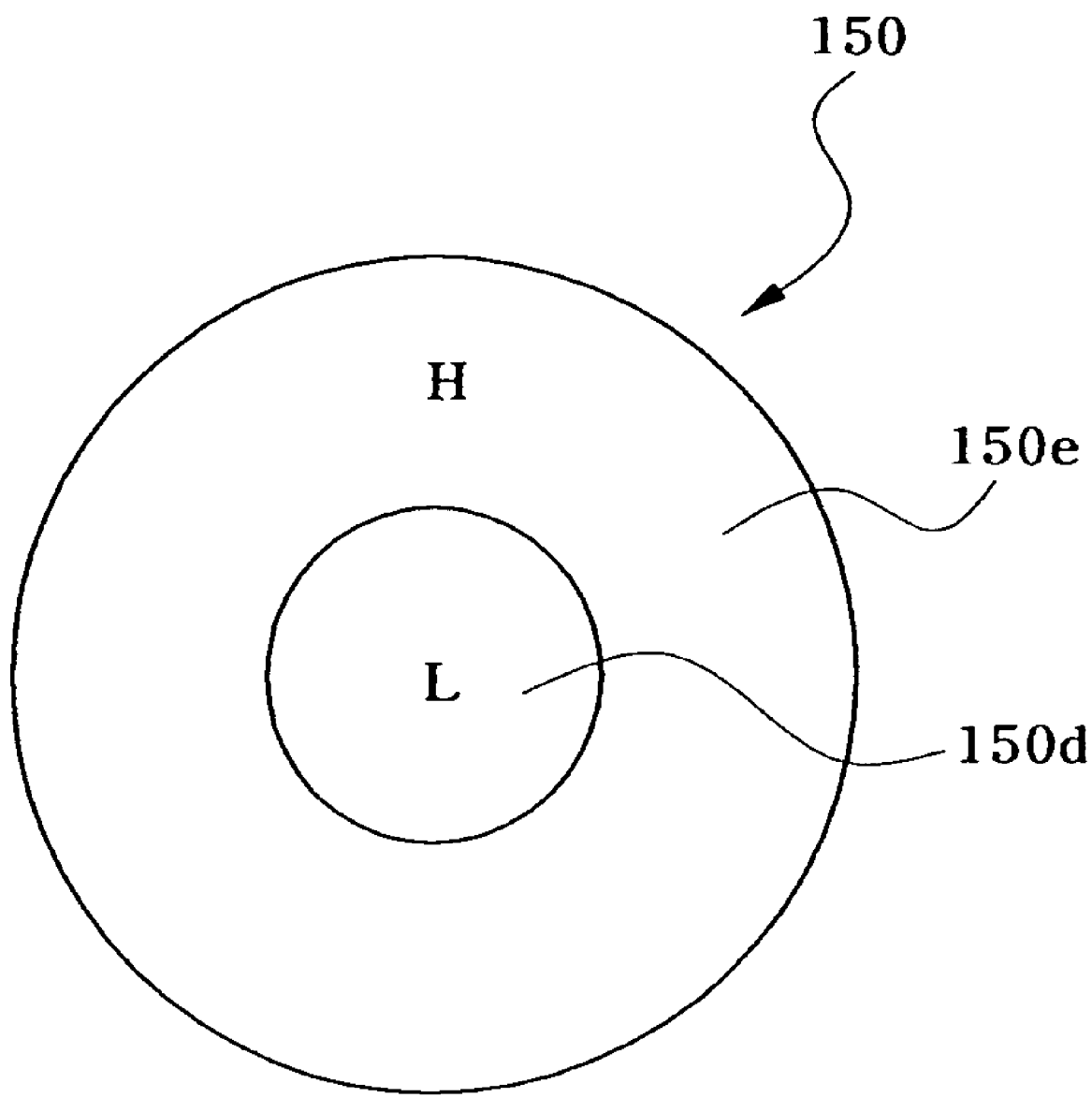

FIGS. 11 and 12 are views for illustrating the distributions of ion implantation energy in a wafer, into which ions are implanted using the ion implantation method in accordance with an embodiment of the present invention.

First, with reference to FIG. 11, when the ion implantation is performed under the condition that the ion implantation energy is controlled, as shown in FIGS. 8 to 10, ions are implanted into the first region 150a and the third region 150c located at upper and lower portions of the wafer 150 at a relatively high implantation energy (H), and ions are implanted into the second region 150b located at the central portion of the wafer 150 at a relatively low implantation energy (L). In alternative embodiments, it should be appreciated that regions 150a-150c could be implanted with different implantation energies. For example, first region 150a could be implanted with a low implantation energy, second region 150b could be implanted with a high implantation energy, and third region 150c could be implanted with a low implantation energy.

On the other hand, with reference to FIG. 12, the ion implantation is performed so that ions are implanted into a central region 150d and an edge region 150e of the wafer 150 at different implantation energies. In this case, while the ion implantation is performed, as shown in FIGS. 8 to 10, the wafer 150 is rotated. That is, when the wafer 150 is rotated under the condition that ions are implanted into upper and lower portions of the wafer 150 at a relatively high implantation energy (H), as shown in FIGS. 8 and 10, the ions are implanted into the edge region 150e of the wafer 150 at the relatively high implantation energy (H). Thereafter, when the wafer 150 is rotated under the condition that ions are implanted into the central portion of the wafer 150 at a relatively low implantation energy (L), as shown in FIG. 9, and the ions are implanted into the central region 150d of the wafer 150 at the relatively low implantation energy (L). In alternative embodiments, it should be appreciated that region 150d could be implanted with high implantation energy, and region 150e could be implanted with low implantation energy.

As apparent from the above description, the present invention provides an ion implantation apparatus and method for obtaining non-uniform implantation energy, in which an ion beam having a low implantation energy passes through the apparatus for one designated time and an ion beam having a high implantation energy passes through the apparatus for another designated time so that the ion beam having the low implantation energy is implanted into a first region of a wafer and the ion beam having the high implantation energy is implanted into a second region of the wafer, thereby compensating for the variation of a threshold voltage in subsequent processes to allow the wafer to have uniform threshold voltage characteristics. Particularly, the ion implantation apparatus and method of the present invention can achieve the control of the characteristics of a device, when the characteristics of the device are not easily controlled by the increase and decrease of a dose of the implanted ions.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An ion implantation apparatus comprising:
   an ion beam source to generate an ion beam;
   an implantation energy controller disposed on a path of the ion beam to control the ion implantation energy of the ion beam so that an ion beam having a first implantation energy is created for a first period of time and an ion beam having a second implantation energy is created for a second period of time;
   a beam line to accelerate the ion beam; and
   an end station to mount a substrate to enable the ion beam accelerated by the beam line can be implanted onto the substrate, and move the substrate in a direction perpendicular to an ion beam incident direction, so that the ion beam having the first implantation energy is implanted into a first region of the substrate and the ion beam having the second implantation energy is implanted into a second region of the substrate.

2. The ion implantation apparatus as set forth in claim 1, wherein the implantation energy controller comprises a plurality of bundle ion beam generators, each of which comprises an electrode disposed on the path of the ion beam and a resonator for switching the electrode on and off, arranged along the path of the ion beam.

3. The ion implantation apparatus as set forth in claim 2, wherein a relatively small number of the plurality of bundle ion beam generators are switched on for the first period of time, and a relatively large number of the plurality of bundle ion beam generators are switched on for the second period of time.

4. The ion implantation apparatus as set forth in claim 2, wherein the resonator switches the electrode on by sequentially applying a positive bias current and a negative bias current to the electrode.

5. The ion implantation apparatus as set forth in claim 1, wherein the end station comprises a substrate supporter for rotating the substrate when the ion beam is implanted into the substrate.

6. An ion implantation apparatus comprising:
   an ion beam source to generate an ion beam;
   an implantation energy controller to accelerate the ion beam and being disposed on a path of the accelerated ion beam, the implantation energy controller being configured to control the ion implantation energy of the ion beam so that an ion beam having a first implantation energy is created for a first period of time and an ion beam having a second implantation energy is created for a second period of time, the first implantation energy being lower than the second implantation energy; and
   an end station to mount a substrate, into which the ion beam, the ion implantation energy of which is controlled by the implantation energy controller, is implanted, thereon and moving the substrate in a direction perpendicular to an ion beam incident direction, so that the ion beam having the first implantation energy is implanted into a first region of the substrate and the ion beam having the second implantation energy is implanted into a second region of the substrate.

7. The ion implantation apparatus as set forth in claim 6, wherein the end station comprises a substrate supporter for rotating the substrate when the ion beam is implanted into the substrate.

8. An ion implantation method comprising:
   controlling the ion implantation energy of an ion beam so that an ion beam having a first implantation energy is created for a first period of time and an ion beam having a second implantation energy is created for a second period of time; and
   implanting ions into a substrate disposed on a path of the ion beam under the condition that the substrate is moved in the direction perpendicular to an ion beam incident direction when the ion beam is implanted into the substrate, so that the ion beam having the first implantation energy is implanted into a first region of the substrate and the ion beam having the second implantation energy is implanted into a second region of the substrate.

9. The ion implantation method as set forth in claim 8, further comprising rotating the substrate during the implanting of the ions.

10. The ion implantation method as set forth in claim 8, wherein the controlling of the ion implantation energy comprises:
    arranging a plurality of bundle ion beam generators, each of which comprises an electrode and a resonator for switching the electrode on and off, along the path of the ion beam; and
    switching a relatively small number of the plurality of bundle ion beam generators on for the first period of time, and switching a relatively large number of the plurality of bundle ion beam generators on for the second period of time.

11. The ion implantation method as set forth in claim 10, further comprising rotating the substrate when the ion beam is implanted into the substrate.

* * * * *